United States Patent
Sendelbach et al.

(10) Patent No.: US 8,157,978 B2
(45) Date of Patent: Apr. 17, 2012

(54) ETCHING SYSTEM AND METHOD FOR FORMING MULTIPLE POROUS SEMICONDUCTOR REGIONS WITH DIFFERENT OPTICAL AND STRUCTURAL PROPERTIES ON A SINGLE SEMICONDUCTOR WAFER

(75) Inventors: Matthew J. Sendelbach, Fishkill, NY (US); Alok Vaid, Beacon, NY (US); Shahin Zangooie, San Jose, CA (US)

(73) Assignees: International Business Machines Corporation, Armonk, NY (US); Advanced Micro Devices, Sunnyvale, CA (US); GlobalFoundries Inc., Milpitas, CA (US)

( * ) Notice: Subject to any disclaimer, the term of this patent is extended or adjusted under 35 U.S.C. 154(b) by 592 days.

(21) Appl. No.: 12/361,736

(22) Filed: Jan. 29, 2009

(65) Prior Publication Data

US 2010/0187126 A1 Jul. 29, 2010

(51) Int. Cl.
C25D 5/02 (2006.01)
C25D 17/00 (2006.01)
(52) U.S. Cl. .................................. 205/118; 204/224 R
(58) Field of Classification Search ............. 204/224 M; 205/118, 640
See application file for complete search history.

(56) References Cited

U.S. PATENT DOCUMENTS

| | | | |
|---|---|---|---|
| 4,303,482 A | 12/1981 | Buhne et al. | |
| 5,360,759 A | 11/1994 | Stengl et al. | |
| 5,501,787 A | 3/1996 | Bassous et al. | |
| 5,516,412 A | 5/1996 | Andricacos et al. | |
| 5,965,005 A | 10/1999 | Lee et al. | |
| 6,171,512 B1 | 1/2001 | Sakaguchi et al. | |
| 6,277,662 B1 | 8/2001 | Nagata | |
| 6,395,152 B1 * | 5/2002 | Wang | 204/224 M |
| 6,468,663 B1 | 10/2002 | Sato et al. | |
| 7,148,119 B1 | 12/2006 | Sakaguchi et al. | |
| 7,231,123 B2 | 6/2007 | Sugita et al. | |
| 7,670,466 B2 * | 3/2010 | Lee | 204/224 M |
| 2004/0040863 A1 * | 3/2004 | Lee et al. | 205/640 |
| 2006/0234604 A1 | 10/2006 | Lee et al. | |

FOREIGN PATENT DOCUMENTS

WO WO2005060379 7/2005

OTHER PUBLICATIONS

International Search Report and the Written Opinion.
International Search Report and Written Opinion PCT/EP2009/066745.

* cited by examiner

*Primary Examiner* — Luan Van
(74) *Attorney, Agent, or Firm* — Gibb I.P. Law Firm, LLC; Yuanmin Cai, Esq.

(57) ABSTRACT

Disclosed is an electrochemical etching system with localized etching capability. The system allows multiple different porous semiconductor regions to be formed on a single semiconductor wafer. Localized etching is achieved through the use of one or more stationary and/or movable computer-controlled inner containers operating within an outer container. The outer container holds the electrolyte solution and acts as an electrolyte supply source for the inner container(s). The inner container(s) limit the size of the etched region of the semiconductor wafer by confining the electric field. Additionally, the current amount passing through each inner container during the electrochemical etching process can be selectively adjusted to achieve a desired result within the etched region. Localized etching of sub-regions within each etched region can also be achieved through the use of different stationary and/or moveable electrode structures and shields within each inner container. Also disclosed are associated method embodiments.

11 Claims, 9 Drawing Sheets

ETCHING SYSTEM AND METHOD FOR FORMING MULTIPLE POROUS SEMICONDUCTOR REGIONS WITH DIFFERENT OPTICAL AND STRUCTURAL PROPERTIES ON A SINGLE SEMICONDUCTOR WAFER

BACKGROUND

1. Field of the Invention

The embodiments of the invention generally relate to the formation of porous semiconductor structures and, more particularly, to an etching system and method for forming multiple porous semiconductor regions, having different optical and structural properties, on a single semiconductor wafer.

2. Description of the Related Art

Electrochemical etching of semiconductors (e.g., silicon (Si), silicon carbide (SiC), gallium arsenide (GaAs), etc.) to produce high surface area porous structures is a well controlled and fast technique often utilized by the photonic and semiconductor research and development (R&D) and manufacturing groups. Typically, this electrochemical etching process is performed in the presence of a computer controlled (e.g., a galvanostat controlled) environment so that a constant current is maintained and applied to the entire wafer throughout the electrochemical etching process. Such a constant current ensures uniform etching and, thereby ensures that the resulting wafer has a uniform porous surface (i.e., a surface with uniform optical and structural properties). However, there is a need in the art for an electrochemical etching system with localized etching capability and method that would allow for multiple porous semiconductor regions, having different optical and structural properties, to be formed on a single semiconductor wafer.

SUMMARY

One embodiment of an electrochemical etching system according to the present invention comprises a first container, a second container that is larger in size than the first container, and a current source. The first container has a first end and a second end. The first end is an open end (i.e., it has an opening) and the second end is a closed end. A first electrode (i.e., a cathode) is positioned within the first container at the closed end. The second container is an electrolyte bath. That is, the second container contains an electrolyte solution. The second container also contains, within the electrolyte solution, a workpiece (e.g., a semiconductor substrate), a second electrode and the first container. In operation, the second electrode is positioned within the electrolyte solution adjacent to the bottom surface of the workpiece such that the top surface of the workpiece forms an anode. The first container is positioned within the electrolyte solution such that the first container is filled with the electrolyte solution and further such that the opening (i.e., the open end) is adjacent to the top surface of the workpiece and, specifically, opposite the second electrode. The current source is connected to both the first electrode and the second electrode creating a circuit through the electrolyte solution and particularly through the electrolyte solution within the first container. Thus, the current source can provide a current flow through the electrolyte solution within the first container between the first electrode and the second electrode. This current flow can be controlled in order to selectively etch only that region of the top surface of the workpiece adjacent to the opening of the first container. Furthermore, the position of the workpiece relative to the first container can be controlled (e.g., in a continuous or stepped manner) to allow for etching of different regions of the top surface of the workpiece. As the position of the workpiece relative to the first container is varied, the current flow can also be varied in order to achieve different structural and/or optical properties in the different regions.

Another embodiment of the electrochemical etching system according to the present invention comprises multiple first containers to allow for simultaneous etching of multiple different regions of the top surface of the workpiece. That is, this embodiment of the etching system comprises a plurality of first containers, a second container that is larger in size than the first containers and a plurality of individually controllable current sources. Each first container has a first end (i.e., an open end) and a second end (i.e., a closed end). Within each first container, there is a first electrode (i.e., a cathode) at the closed end. The second container contains an electrolyte solution and also contains, within the electrolyte solution, a workpiece (e.g., a semiconductor wafer), a plurality of second electrodes, and the first containers. In operation, the second electrodes are positioned within the electrolyte solution adjacent to the bottom surface of the workpiece. The first containers are positioned within the electrolyte solution such that the electrolyte solution fills the first containers and further such that the opening (i.e., the open end) of each one of the first containers is positioned adjacent to the top surface of the workpiece and, specifically, opposite one of the second electrodes, thereby forming multiple first electrode-second electrode pairs. Each current source is connected to a corresponding first electrode-second electrode pair, creating a circuit through the electrolyte solution within the corresponding first container. Each current source is further individually controllable and capable of providing a current flow through the electrolyte solution between its corresponding first electrode-second electrode pair in order to selectively etch a specific region of the top surface of the workpiece (i.e., to selectively etch the region of the top surface of the workpiece adjacent to the opening of the first container holding the first electrode in the corresponding electrode pair). Thus, the multiple individually controllable first containers allow for simultaneous etching of different regions of the top surface of the workpiece and can further be used to achieve different structural and/or optical properties in those different regions.

Also disclosed herein are method embodiments for performing an electrochemical etch using the above described system embodiments. One method embodiment comprises providing the first electrochemical etching system, described above. A workpiece (e.g., a semiconductor wafer) is placed in the electrolyte solution within the second container such that the second electrode is adjacent to the bottom surface of the workpiece and further such that the opening of the first container, which is filled with the electrolyte solution, is adjacent to the top surface of the workpiece opposite the second electrode. Next, current flow through the electrolyte solution within the first container between the first electrode and the second electrode is selectively controlled so as to selectively etch a region of the top surface of the workpiece adjacent to the opening in the first container. Additionally, this method embodiment can comprise moving the position of the workpiece relative to the first container (e.g., in a continuous or stepped manner) to allow for etching of different regions of the top surface of the workpiece. As the position of the workpiece relative to the first container is varied, the current flow can also be varied in order to achieve different structural and/or optical properties in the different regions.

Another method embodiment comprises providing the second electrochemical etching system, described above. In this embodiment, the workpiece is placed in the electrolyte solution within the second container such that the second electrodes are adjacent to the bottom surface of the workpiece and further such that the opening of each one of the first containers, which are filled with electrolyte solution, is adjacent to the top surface of the workpiece opposite one of the second electrodes, thereby forming multiple first electrode-second electrode pairs. Next, current flow through the electrolyte solution within each first container between each one of the multiple first electrode-second electrode pairs is individually controlled so as to selectively etch multiple regions of the top surface of the workpiece. That is, each first container is used to etch a different region of the top surface of the workpiece, that region corresponding to the opening of the first container in each of the electrode pairs. Thus, the multiple individually controlled first containers allow for simultaneous etching of different regions of the top surface of the workpiece and further can be used to achieve different structural and/or optical properties in those different regions.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, electrochemical etching of semiconductors (e.g., silicon (Si), silicon carbide (SiC), gallium arsenide (GaAs), etc.) to produce high surface area porous structures is a well controlled and fast technique often utilized by the photonic and semiconductor research and development (R&D) and manufacturing groups. Typically, this electrochemical etching process is performed in the presence of a computer controlled (e.g., a galvanostat controlled) environment so that a constant current is maintained and applied to the entire wafer throughout the electrochemical etching process. Such a constant current ensures uniform etching and, thereby ensures that the resulting wafer has a uniform porous surface (i.e., a surface with uniform optical and structural properties). However, there is a need in the art for an electrochemical etching system with localized etching capabilities and method that would allow for multiple porous semiconductor regions, having different optical and structural properties, to be formed on a single semiconductor wafer.

In view of the foregoing, disclosed herein are embodiments of an electrochemical etching system with localized etching capability. The system embodiments allow multiple porous semiconductor regions, having different optical and structural properties, to be formed on a single semiconductor wafer. The localized etching capability is achieved through the use of one or more stationary and/or movable computer-controlled inner containers operating within an outer container. The outer container holds the electrolyte solution and acts as an electrolyte supply source for the inner container(s) so that constant concentrations of chemical species are maintained throughout the electrochemical etching process. The inner container(s) limit the size of the etched region of the semiconductor wafer by confining the electric field. Additionally, the current amount passing through each inner container during the electrochemical etching process can be selectively adjusted to achieve a desired result within the etched region. Localized etching of sub-regions within each etched region can also be achieved through the use of different stationary and/or moveable electrode structures and shields within each inner container. Also disclosed are associated method embodiments.

Figure 1:
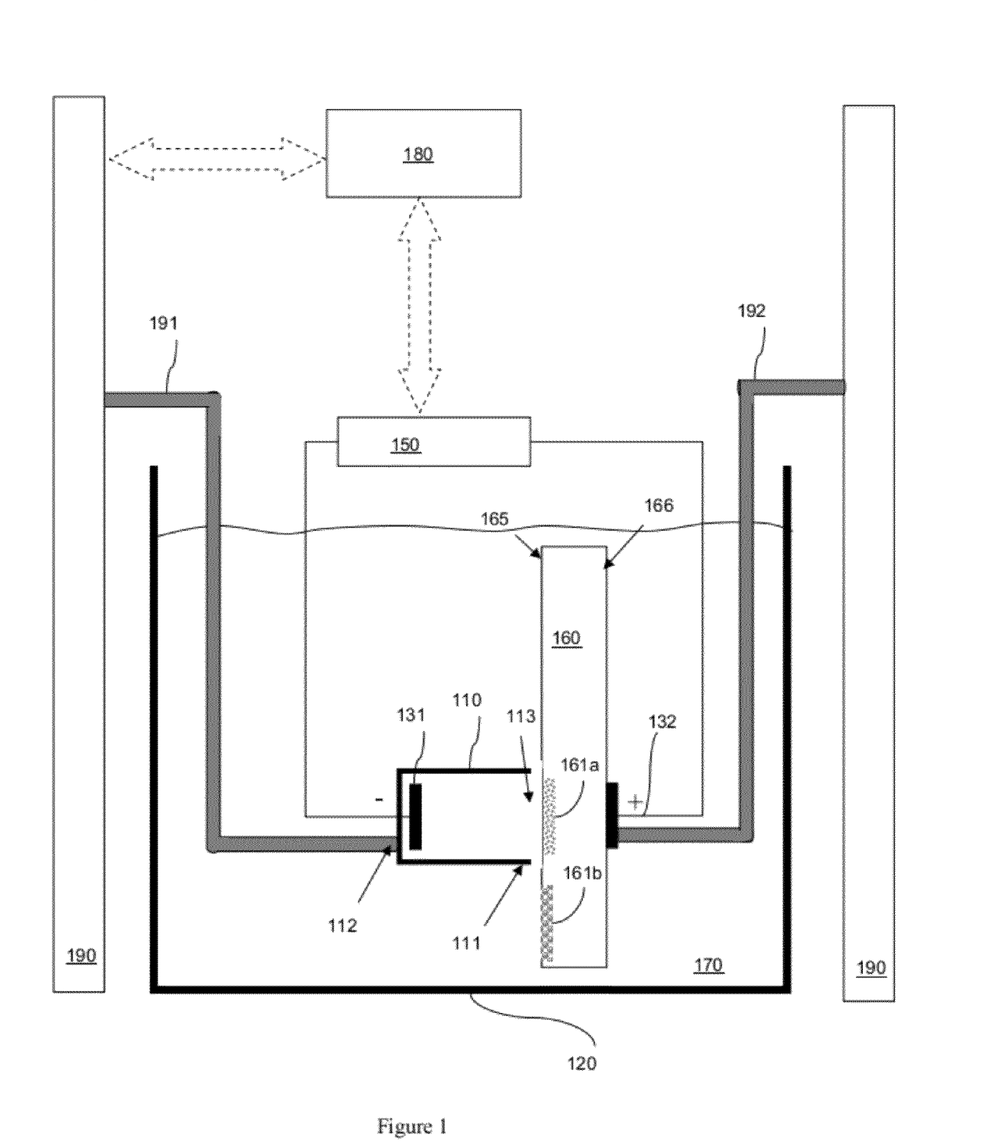
FIG. 1 is a schematic drawing illustrating of one embodiment of an electrochemical etching system according to the present invention.

More particularly, referring to FIG. 1, one embodiment 100 of an electrochemical etching system according to the present invention comprises a first container 110 (i.e., an inner container) and a second container 120 (i.e., an outer container) that is larger in size than the first container 110. These containers 110, 120 are formed of corrosion-resistant materials. For example, they can be formed with or coated with Teflon® or Teflon-like materials suitable for preventing corrosion in acidic solutions.

The inner container 110 is an inner container having a first end 111 and a second end 112 opposite the first end 111. The first end 111 is an open end (i.e., it has an opening 113) and the second end 112 is a closed end. A first electrode 131 (i.e., a cathode) is positioned within the inner container 110 and connected to the closed end 112. This first electrode 131 can, for example, comprise gold, platinum, or some other cathode-suitable metal for electrochemical etching. Additionally, this first electrode 131 can be in the form of a wire, plate or mesh material, depending upon the desired etch pattern (see detailed discussion of first electrode 131 structure below).

The outer container 120 is an electrolyte bath. That is, the outer container 120 contains an electrolyte solution 170. This electrolyte solution 170 can comprise a corrosive acidic mixture, for example, of water, acid (e.g., hydrofluoric acid (HF), hydrochloric acid (HCl), or some other suitable acid material) and any other material which may be beneficial during the electrochemical etch process (e.g., ethanol, see detailed discussion below). The outer container 120 also contains, within the electrolyte solution 170, a workpiece 160 (e.g., a semiconductor substrate, such as a bulk silicon wafer or silicon-on-insulator (SOI) wafer), a second electrode 132 and the inner container 110 such that the inner container 110 is filled with the electrolyte solution 170. The second electrode 132 can, for example, comprise gold, platinum or some other suitable electrode material. It should be noted that while the system 100 is illustrated in FIG. 1 with the workpiece 160 oriented vertically within the outer container 120, a similarly configured system with the workpiece 160 oriented horizontally within the outer container 120 is also anticipated.

In operation, the second electrode 132 is an ohmic contact positioned within the electrolyte solution 170 in contact with the bottom surface 166 of the workpiece 160. The inner container 110 is positioned within the electrolyte solution 170 such that the opening 113 (i.e., the open end 111) is adjacent to the top surface 165 of the workpiece 160 and, specifically, opposite the second electrode 132. The inner container 110 can be spaced slightly away from the top surface 165 of the workpiece 160 (as shown) or the inner container 110 can be configured with openings (not shown) in order to ensure that the electrolyte solution 170 flows between the inner container 110 and outer container 120.

A current source 150 (e.g., a DC power supply) is connected to both the first electrode 131 and the second electrode 132 creating a circuit through the electrolyte solution 170 within the inner container 110. Specifically, the first electrode 131 is connected to the negative node of the current source 150, thus forming a cathode. The second electrode 132 (i.e., the ohmic contact on the back surface 166 of the workpiece 160) is connected to the positive node of the current source 150, thus transforming the top surface of the workpiece 160 into an anode. It should be noted that wire connections between the electrodes 131, 132 and the current source 150 should be of a corrosion-resistant wire (e.g., gold or platinum) or coated with a protective coating, such as Teflon® or Teflon-like materials suitable for preventing corrosion in acidic solutions. Furthermore, optionally, the surface of the second electrode 132 not adjacent to the bottom surface of the workpiece 160 can be coated with Teflon® or a Teflon-like material or covered by a Teflon® or a Teflon-like cover so as to confine any electromagnetic field Consequently, this current source 150 can provide a current flow through the electrolyte solution 170 within the inner container between the first electrode 131 and the second electrode 132. This current flow can be controlled by a controller 180 in order to selectively etch only that region 161a of the top surface 165 of the workpiece 160 adjacent to the opening 113 of the inner container 110. The controller 180 can, for example, comprise a galvanostat or computer employing LabView software. The inner container 110 contains the electric field so that the etched region is limited in size.

Thus, if the workpiece 160 comprises a semiconductor wafer, such a current flow can selectively etch the top surface 165 in order to form a localized porous semiconductor region 161a on the semiconductor wafer. This localized porous semiconductor region 161a will have a predetermined size corresponding to the size of the opening 113 in the inner container 110. This localized porous semiconductor region 161a can also have predetermined structural and optical properties. Specifically, the controller 180 can control the amount of current flowing from the current source 150 during the etch process in order to achieve a desired porosity and thickness.

It should be noted that, when forming porous semiconductor regions 161a-b in this manner, ethanol in particular can be incorporated into the electrolyte solution 170. The ethanol facilitates the removal of hydrogen molecules during the electrochemical etching process which may build up on the surface of semiconductor wafer. Without the ethanol, hydrogen bubbles may become trapped within the resulting pores and may disrupt the semiconductor-electrolyte contact giving rise to a diversion of the current flow away from the main pores promoting side pore growth. Thus, an electrolyte solution 170 with ethanol will allow for more uniform porous layers. Furthermore, it is assumed that the semiconductor wafer is highly doped and therefore the ohmic contact 132 on the bottom surface 166 of the wafer should not require extraordinary treatments.

Another aspect of this embodiment 100 of the system of the present invention is that the position of the workpiece 160 relative to the inner container 110 can be controlled (e.g., in a continuous or stepped manner) to allow for localized etching of multiple different regions (e.g., 161a, 161b, etc.) of the top surface 160 of the workpiece 160. Specifically, the embodiment 100 can further comprise corrosion-resistant holders 191, 192 adapted to hold the inner container 110 and the second electrode 132, respectively, adjacent to the workpiece 160 within the electrolyte solution 170. These holders 191, 192 can comprise a corrosion-resistant material and can be selectively moveable so as to allow the positions of the opening 113 of the inner container 110 and of the second electrode 132 to be varied (e.g., horizontally, vertically, or otherwise) and, thereby to allow for localized etching of multiple different regions 161a, 161b, etc. of the top surface 165 of the workpiece 160.

Movement of these holders 191, 192 can be accomplished by means of suitable motorized drive mechanisms 190 controlled by the controller 180. For example, the controller 180 can control the motorized drive mechanisms 190 so as to cause the holders 191, 192 to move symmetrically in a continuous manner in order to provide continuous etching of the different regions of the top surface 165 of the workpiece 160. The controller 180 can also control the motorized drive mechanisms 190 so as to cause the holders 191, 192 to move symmetrically in a stepped manner in order to provide stepped etching of the different regions 161a, 161b, etc. of the top surface 165 of the wafer 160. It should be noted a second electrode 132 is not required and movement thereof by a holder 192 would not be required if the entire wafer 160 is properly connected to the current source 150 and capable of maintaining a constant potential.

Alternatively, the workpiece 160 can be moved relative to the inner container 110 and the second electrode 132. That is, a holder (not shown) holding the workpiece 160 adjacent to the inner container 110 and the second electrode 132 within the electrolyte solution 170 can be moveable, in the same manner as the holders 191 described above, so as to allow for localized etching (e.g., continuous or stepped) of different regions 161a, 161b, etc. of the top surface 160 of the workpiece 160.

It should be noted that as the position of the workpiece 160 relative to the inner container 110 and the second electrode 132 is varied, the controller 180 can further communicate with the current source 150 in order to turn on and off the current flow, as needed, and/or to adjust the amount of current flow in order to achieve different structural and/or optical properties (i.e., different porosity) in different regions 161a, 161b, etc. of the top surface 165 of the workpiece 160. For example, the size of the opening 113 in the inner container 110 can correspond to the size of a die. If a step and etch technique is used, the stepped movements can correspond to the die size as well as the known spacing between dies and a designer/manufacturer can chose to utilize different current densities in order to obtain different porosity at each die. Alternatively, a designer/manufacture may mass produce nominally identical dies by using the same current density and etching conditions at each die. If a continuous etching technique is used, striped substrate surfaces can be created (e.g., with each stripe having a different porosity). These stripes can be considerably larger in size compared with the dimensions of the interior inner container 110. Furthermore, the current density may be varied to create porosity (optical constants) gradients. These types of gradients may find several implementations in metrology tool quality control and photonics. Note that the continuous etching technique may be used to create die size structures similar to the ones created using the step and etch technique by periodically turning off the current along the scan direction.

Figure 2A:
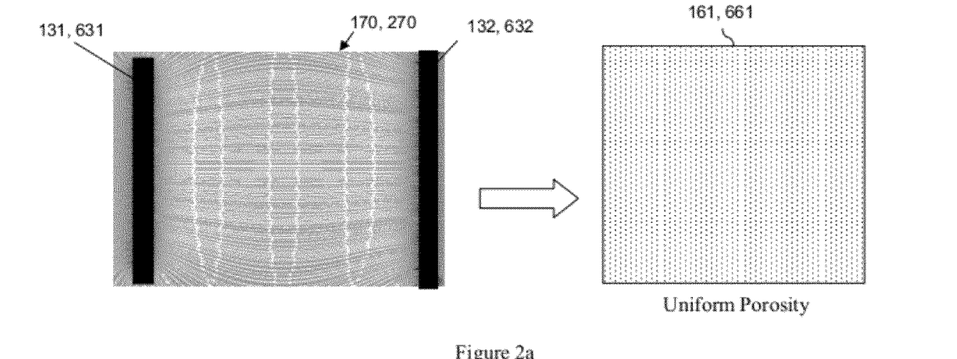
FIG. 2a is drawing illustrating uniform current density as a function of electrode shape and the resulting etched surface structure.
Figure 2B:
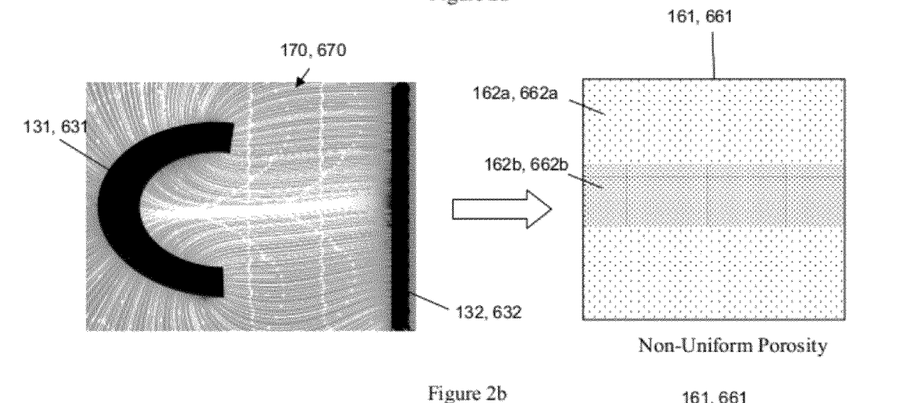
FIG. 2b is a drawing illustrating non-uniform current density as a function of electrode shape and the resulting etched surface structure.
Figure 2C:
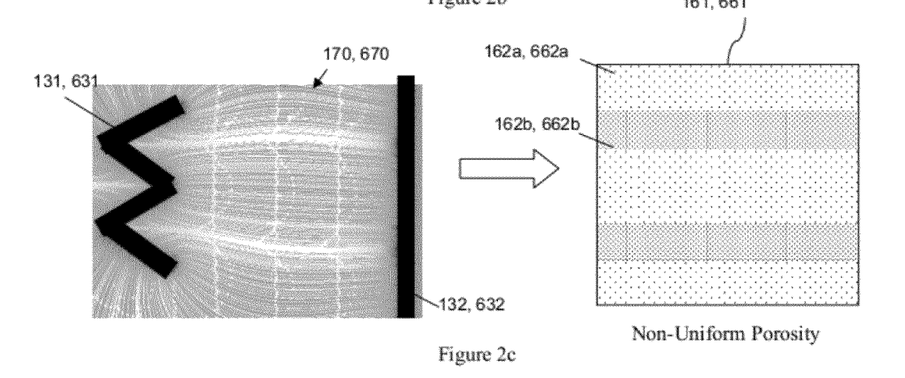
FIG. 2c is another drawing illustrating non-uniform current density as a function of electrode shape and the resulting etched surface structure.

Yet another aspect of this embodiment 100 of the present invention is that localized etching of sub-regions within each etched region 161 of the top surface 165 of the workpiece 160 can be achieved through the use of different stationary and/or moveable electrode structures and/or shields within the inner container. Specifically, as mentioned above, the first electrode 131 within the inner container 110 can comprise gold, platinum, or some other cathode-suitable metal for electrochemical etching. Additionally, this first electrode 131 can be in the form of a wire, plate or mesh material. If the first electrode 131 comprises a planar shape, the planar shape will cause the current density within the electrolyte solution 170 in the inner container 110 to be essentially uniform, creating an essentially uniformly etched surface structure within an etched region 161 of the top surface 165 of the workpiece (as illustrated in FIG. 2a in combination with FIG. 1). However, if the first electrode 131 comprises a non-planar shape, this non-planar shape will cause the current density within the electrolyte solution 170 in the inner container 110 to become non-uniform, creating a non-uniformly etched surface structure within an etched region 161 of the top surface 165 of the workpiece 160 (as illustrated in FIGS. 2b and 2c in combination with FIG. 1). Those skilled in the art will recognize that higher current density results in greater etching and, thereby higher. So, by varying the shape of the first electrode 131 within the inner container 110 different etch patterns can be achieved within each etched region 161 of the top surface 165 of the workpiece 160 (e.g., see sub-regions 162a and 162b with different porosities and thicknesses). As an alternative to the mechanical deformation of the first electrode 131 (i.e., of a cathode wire or plate) shown in FIGS. 2b and 2c, it is possible to create miniaturized shapes (not shown) on the surface of the first electrode 131, using known imprint and/or lithographic techniques. These miniaturized shapes formed on the first electrode 131 can similarly be used to vary current density and may yield better localized and micro-etching capabilities.

Figure 3:
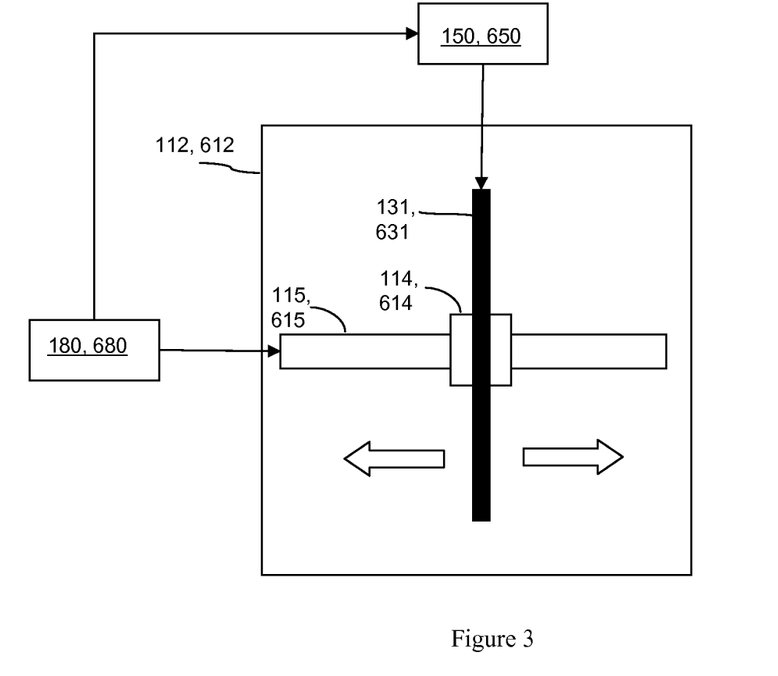
FIG. 3 is a schematic drawing illustrating an optional configuration for the electrochemical etching systems of the present invention.

Additionally, rather than being fixed within the inner container 110, the first electrode 131 can be moveable so as to allow for localized selective etching of sub-regions within each etched region 161 of the top surface 165 of a workpiece 160. Specifically, as illustrated in FIG. 3 in combination with FIG. 1, a corrosion-resistant holder 114 can hold the first electrode 131. This holder 114 can be moveable, for example, along corrosion-resistant rail 115 attached to the closed end 112 of the inner container 110 so that the position of the first electrode 131 relative to the top surface 165 of the workpiece 160 within the region 161 being etched is varied. Movement of the holder 114 can be achieved through a motorized drive mechanism (not shown) and controlled by controller 180. As the position of the first electrode 131 is varied, the controller 180 can further communicate with the current source 150 in order to turn on and off the current flow, as needed, and/or to adjust the amount of current flow in order to achieve different structural and/or optical properties within the region 161 (i.e., different porosities and thicknesses in different sub-regions of region 161).

Figure 4:
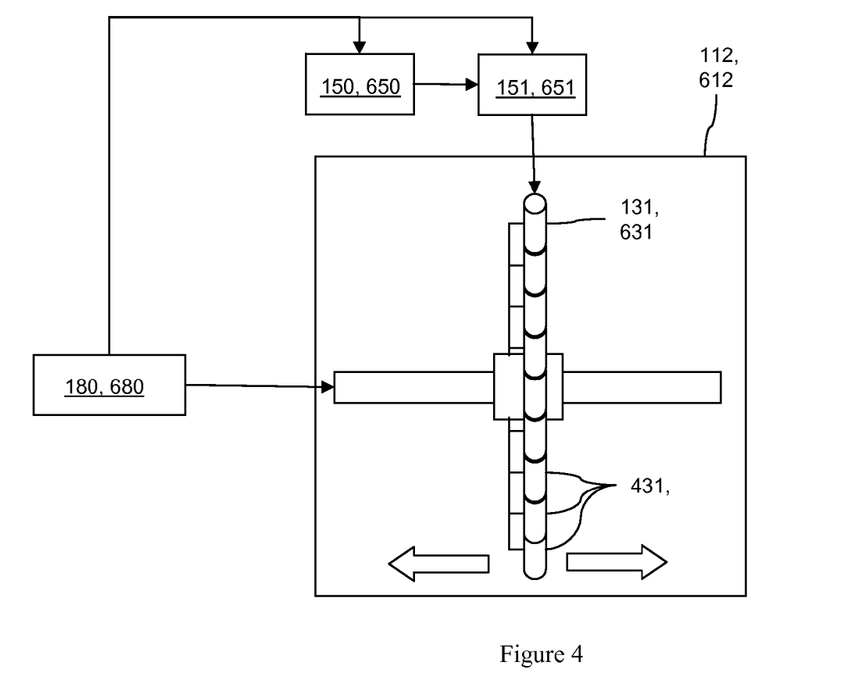
FIG. 4 is a schematic drawing illustrating another optional configuration for the electrochemical etching systems of the present invention.

Furthermore, as illustrated in FIG. 4 in combination with FIGS. 1 and 3, the first electrode 131 can comprise, not a single piece of metal, but rather a plurality of isolated segments 431. Each of the isolated segments 431 can be selectively connected (e.g., either individually or in combination) to the current source 150, for example, by a multiplexor 151. The multiplexor 151 can, for example, be controlled by the controller 180 so as to allow for localized selective etching of sub-regions within the region 161.

Figure 5:
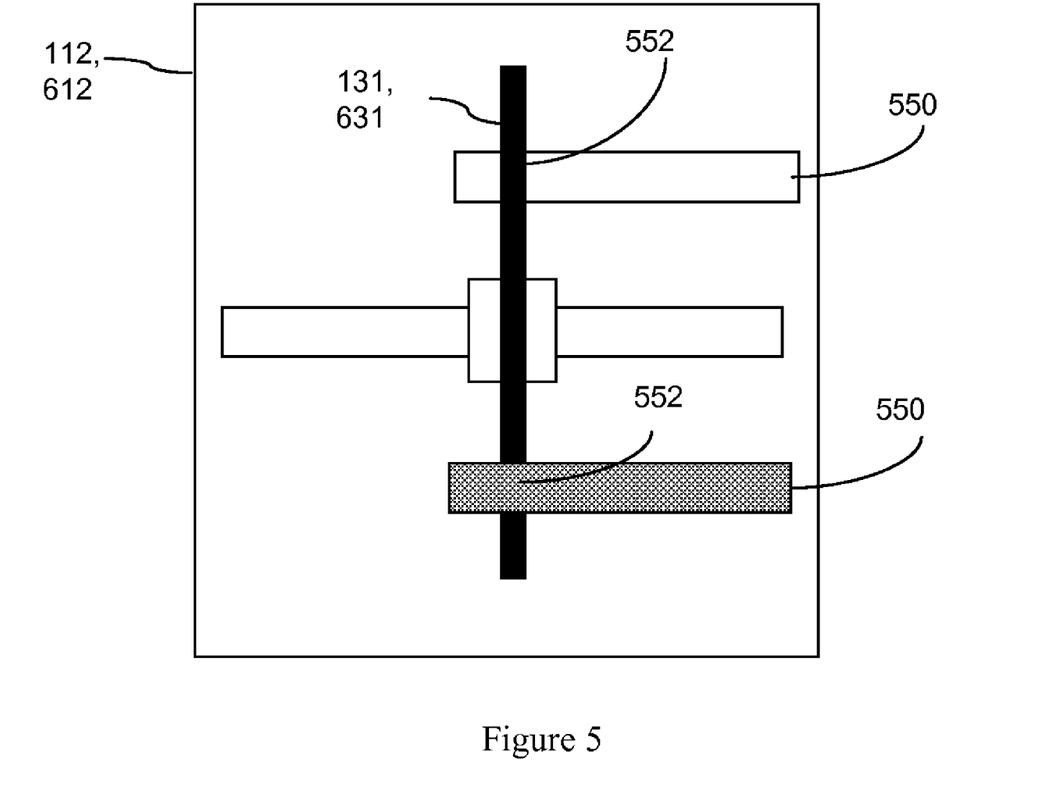
FIG. 5 is a schematic drawing illustrating yet another optional configuration for the electrochemical etching systems of the present invention.

Finally, as illustrated in FIG. 5 in combination with FIGS. 1 and 3, one or more electromagnetic shields 550 can be positioned within the inner container 110 between at least one selected section 552 of the first electrode 131 and the top surface 161 of the workpiece 160. Such a shield 550 can block/divert current flow to avoid or at least minimize etching in some sub-regions with the region 161 and, thereby allow for localized selective etching of one or more different sub-regions within the region 161.

Figure 6:
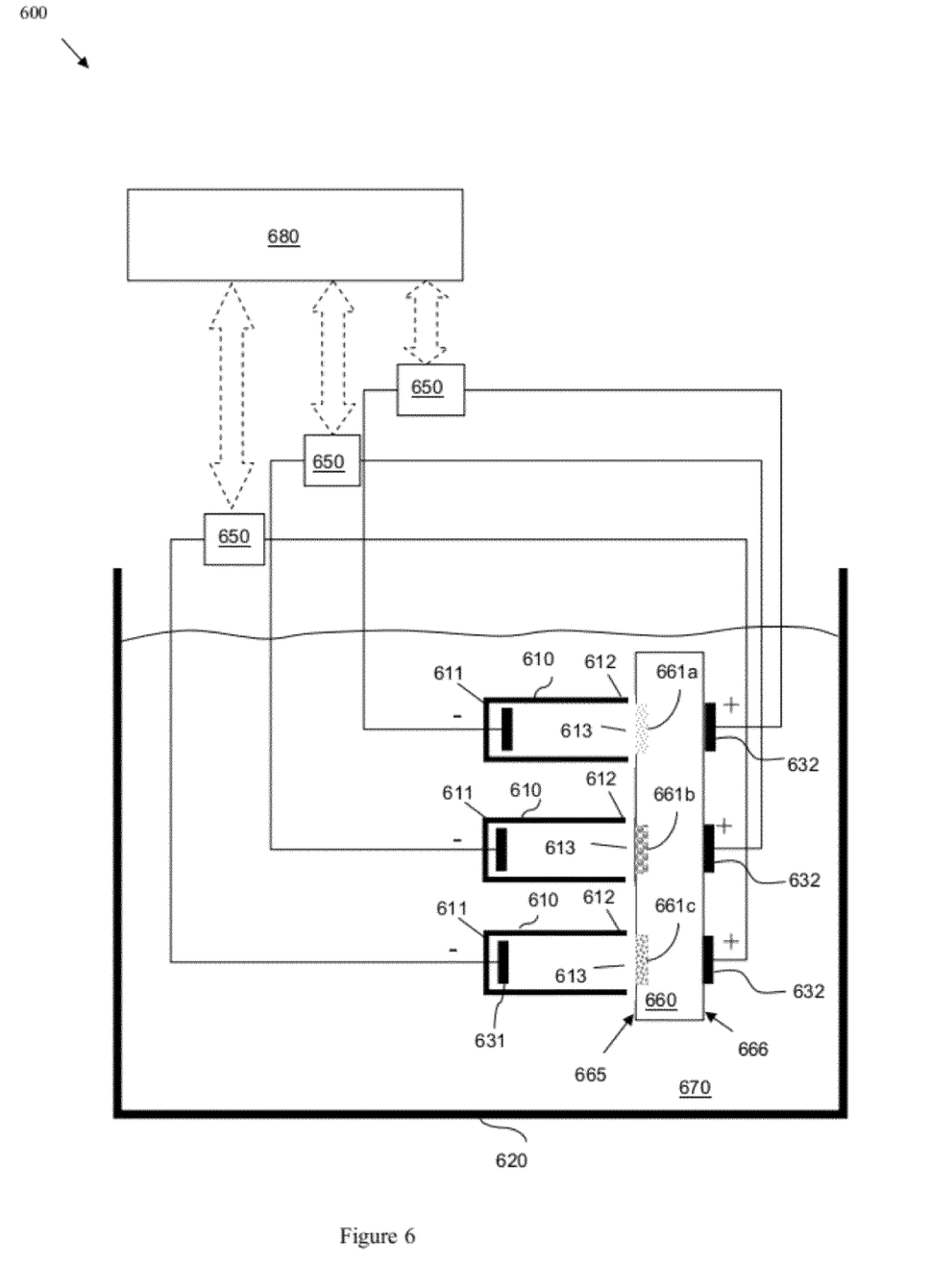
FIG. 6 is a schematic drawing illustrating of another embodiment of an electrochemical etching system according to the present invention.

Referring to FIG. 6, another embodiment 600 of the electrochemical etching system according to the present invention comprises multiple first containers 610 (i.e., multiple inner containers) to allow for simultaneous etching of multiple different regions 661a, 661b, 661c, etc. of the top surface 665 of the workpiece 660. Specifically, this embodiment 200 of the etching system comprises a plurality of first containers 610 (i.e., inner containers) and a second container 620 (i.e., an outer container) that is larger in size than all of the inner containers 610 combined.

It should be noted that, for illustration purposes, FIG. 6 shows only three inner containers; however, any number of inner containers 610 is anticipated. These containers 610, 620 are formed of corrosion-resistant materials. For example, they can be formed with or coated with Teflon® or Teflon-like materials suitable for preventing corrosion in acidic solutions. Additionally, for illustration purposes each first container 610 (i.e., each inner container 610) is shown as a discrete unit. However, it is anticipated that these inner containers 610 may be physically connected with predetermined spaces between the inner containers 610 corresponding to the desired spaces between etched regions 661a-c on the workpiece 660, thereby forming a single unit for ease of operation.

Each inner container 610 is an etching cell having a first end 611 and a second end 612 opposite the first end 611. The first end 611 is an open end (i.e., it has an opening 613) and the second end 612 is a closed end. A first electrode 631 (i.e., a cathode) is positioned within each one of the inner containers 610 and connected to the closed end 612. These first electrodes 631 can, for example, comprise gold, platinum, or some other cathode-suitable metal for electrochemical etching. Each first electrode 631 can be in the form of a wire, plate or mesh material. Finally, each of the first electrodes 631 in the different inner containers 610 can comprise the same structure and/or materials or they can comprise different structures and/or materials, depending upon the desired etch patterns for the different regions 661 of the workpiece 660 (see detailed discussion below).

The second container 620 is an electrolyte bath. That is, the outer container 620 contains an electrolyte solution 670. This electrolyte solution 670 can comprise a corrosive acidic mixture, for example, of water, acid (e.g., hydrofluoric acid (HF), hydrochloric acid (HCl), or some other suitable acid material)

and any other material which may be beneficial during the electrochemical etch process (e.g., ethanol, see detailed discussion below). The outer container 620 also contains, within the electrolyte solution 670, a workpiece 660 (e.g., a semiconductor substrate, such as a bulk silicon wafer or silicon-on-insulator (SOI) wafer), a plurality of second electrodes 632 and the inner containers 610, which are filled with the electrolyte solution 670.

In operation, the second electrodes 632 are positioned within the electrolyte solution 670 adjacent to (i.e., in contact with) the bottom surface 666 of the workpiece 660. The inner containers 610 are positioned within the electrolyte solution 670 such that they are filled with the electrolyte solution 670 and further such that the opening 613 (i.e., the open end 612) of each one of the inner containers 610 is positioned adjacent to the top surface 665 of the workpiece 660 and, specifically, opposite one of the second electrodes 632, thereby forming multiple first electrode-second electrode pairs. Additionally, each inner container 610 can be spaced slightly away from the top surface 665 of the workpiece 660 (as shown) and/or the inner containers 610 can each be configured with openings (not shown) in order to ensure that the electrolyte solution 670 flows between the inner containers 610 and outer container 620.

Current sources 650 are each connected to a corresponding first electrode-second electrode pair, creating multiple different circuits through the electrolyte solution 670. Specifically, for each inner container 610, the first electrode 631 is connected to the negative node of a given current source 650, thus forming a cathode. A second electrode 632 (i.e., the ohmic contact on the back surface 666 of the workpiece 660 opposite the first electrode 631) is connected to the positive node of that same current source 650, thus transforming the top surface of the workpiece 660 into an anode. Each current source 650 is further individually controllable by a controller 680 and capable of providing a current flow through the electrolyte solution 670 between its corresponding first electrode-second electrode pair 631-632 in order to selectively etch a specific region (e.g., see regions 661a, 661b, 661c, etc.) of the top surface 665 of the workpiece 660 (i.e., to selectively etch a specific region of the top surface 665 of the workpiece 660 adjacent to the opening 613 of the inner container 610 holding the first electrode 631 in the corresponding electrode pair 631-632). The controller 680 can, for example, comprise a galvanostat or computer employing LabView software. Thus, the multiple individually controllable inner containers 610 allow for simultaneous etching of different regions (e.g., 661a, 661b, 661c, etc.) of the top surface 665 of the workpiece 660 and can further be used to achieve different structural and/or optical properties (e.g., different porosities and thicknesses) in those different regions.

For example, if the workpiece 660 comprises a semiconductor wafer, current flow within each inner container 610 (i.e., inner container) can selectively etch the top surface 665 in the regions 661 in order to form localized porous semiconductor regions 661a-c on the semiconductor wafer 660. Each localized porous semiconductor region 661a-c will have a predetermined size corresponding to the size of the opening 613 in the corresponding inner container 610. Each localized porous semiconductor region 661a-c will also have predetermined structural and optical properties (i.e., predetermined porosities) that may differ from region to region. Specifically, the controller 680 can control the amount of current flowing from each current source 650 between each first electrode-second electrode pair 631-632 during the etch process in order to achieve desired porosities and thicknesses in the different regions 661a-c.

It should be noted that, when forming porous semiconductor regions 661 in this manner, ethanol in particular can be incorporated into the electrolyte solution 670. The ethanol facilitates the removal of hydrogen molecules during the electrochemical etching process which may build up on the surface of semiconductor wafer. Without the ethanol, hydrogen bubbles may become trapped within the resulting pores and may disrupt the semiconductor-electrolyte contact giving rise to a diversion of the current flow away from the main pores promoting side pore growth. Thus, an electrolyte solution 670 with ethanol will allow for more uniform porous layers. Furthermore, it is assumed that the semiconductor wafer is highly doped and therefore the ohmic contact 632 on the bottom surface 666 of the wafer should not require extraordinary treatments.

Another aspect of this embodiment 600 of the present invention is that localized etching of sub-regions within each etched region 661a-c of the top surface 665 of the workpiece can be achieved through the use of different stationary and/or moveable electrode structures and/or shields within the inner container(s). Specifically, as mentioned above, each first electrode 631 within each inner container 610 can comprise gold, platinum, or some other cathode-suitable metal for electrochemical etching. The first electrode 631 in each inner container 610 can be in the form of a wire, plate or mesh material. Additionally, each of the first electrodes 631 in the different inner containers 610 can comprise the same structure and/or materials or they can comprise different structures and/or materials, depending upon the desired etch patterns for the different regions 661 of the workpiece 660.

For example, if a first electrode 631 in one of the inner containers 610 comprises a planar shape, the planar shape will cause the current density within the electrolyte solution 670 in that inner container to be essentially uniform, creating an essentially uniformly etched surface structure within the corresponding etched region 661 of the top surface 665 of the workpiece 660 (as illustrated in FIG. 2a in combination with FIG. 6). If the first electrode 631 in another one of the inner containers 610 comprises a non-planar shape, this non-planar shape will cause the current density within the electrolyte solution 670 in that inner container 610 to become non-uniform, creating a non-uniformly etched surface structure within the corresponding etched region 661 of the top surface 665 of the workpiece 660 (as illustrated in FIGS. 2b and 2c in combination with FIG. 6). Those skilled in the art will recognize that higher current density results in greater etching and, thereby higher. So, by varying the shape of the first electrodes 631 within the different inner containers 610 different etch patterns can be achieved within each of the different etched region 661 of the top surface 665 of the workpiece 660 (e.g., see sub-regions 662a and 662b with different porosities). As an alternative to the mechanical deformation of the first electrode(s) 631 (i.e., of a cathode wire or plate) shown in FIGS. 2b and 2c, it is possible to create miniaturized shapes (not shown) on the surface of the first electrode(s) 631, using known imprint and/or lithographic techniques. These miniaturized shapes formed on the first electrode(s) 631 can similarly be used to vary current density and may yield better localized and micro-etching capabilities.

Additionally, rather than being fixed within each inner container 610, the first electrodes 631 in any one or more of the inner containers 610 can be moveable so as to allow for localized selective etching of sub-regions within each of the corresponding etched regions 661 of the top surface 665 of a workpiece 660. Specifically, as illustrated in FIG. 3 in combination with FIG. 6, in a particular inner container 610 a corrosion-resistant holder 614 can hold the first electrode 631. This holder 614 can be moveable, for example, along corrosion-resistant rail 615 attached to the closed end 612 of the particular inner container 610 so that the position of the first electrode 631 relative to the top surface 665 of the workpiece 660 within the corresponding region 661 being etched is varied. Movement of the holder 614 can be achieved through a motorized drive mechanism (not shown) and controlled by controller 680. As the position of the first electrode 631 is varied, the controller 680 can further communicate with the current source 650 in order to turn on and off the current flow, as needed, and/or to adjust the amount of current flow in order to achieve different structural and/or optical properties within the corresponding region 661 (i.e., different porosities in different sub-regions of a particular region 661).

Furthermore, as illustrated in FIG. 4 in combination with FIGS. 6 and 3, the first electrode 631 in any one or more of the inner containers 610 can comprise, not a single piece of metal, but rather a plurality of isolated segments 431. Each of the isolated segments 431 can be selectively connected (e.g., either individually or in combination) to the current source 650, for example, by a multiplexor 651. The multiplexor 651 can, for example, be controlled by the controller 680 so as to allow for localized selective etching of sub-regions within the corresponding region 661 being etched.

Finally, as illustrated in FIG. 5 in combination with FIGS. 6 and 3, one or more electromagnetic shields 550 can be positioned within any one or more of the inner containers 610 between at least one selected section 552 of the first electrode 631 and the top surface 661 of the workpiece 660. Such a shield 550 can block/divert current flow in order to avoid or at least minimize etching in some sub-regions with the corresponding region 661 being etched and, thereby allow for localized selective etching of one or more different sub-regions within the corresponding region 661.

It should be noted that during operation of each of the above-described electrochemical etching systems 100 and 600, discussed above and illustrated in FIGS. 1 and 6, respectively, acid concentration (i.e., the chemical species concentration) in the electrolyte solution 170, 670 will tend to decrease as a function of the etch time. The main purpose of the outer container (i.e., the electrolyte bath 120 in FIGS. 1 and 620 in FIG. 6) is to provide sufficient chemical species for a nearly constant concentration throughout the entire electrochemical treatment. A refinement to the disclosed electrochemical etching systems 100 and 600 may include providing a continuous replenishing flow of the electrolyte chemical species to the electrolyte bath 120, 620 to maintain a constant chemical condition.

Figure 7A:
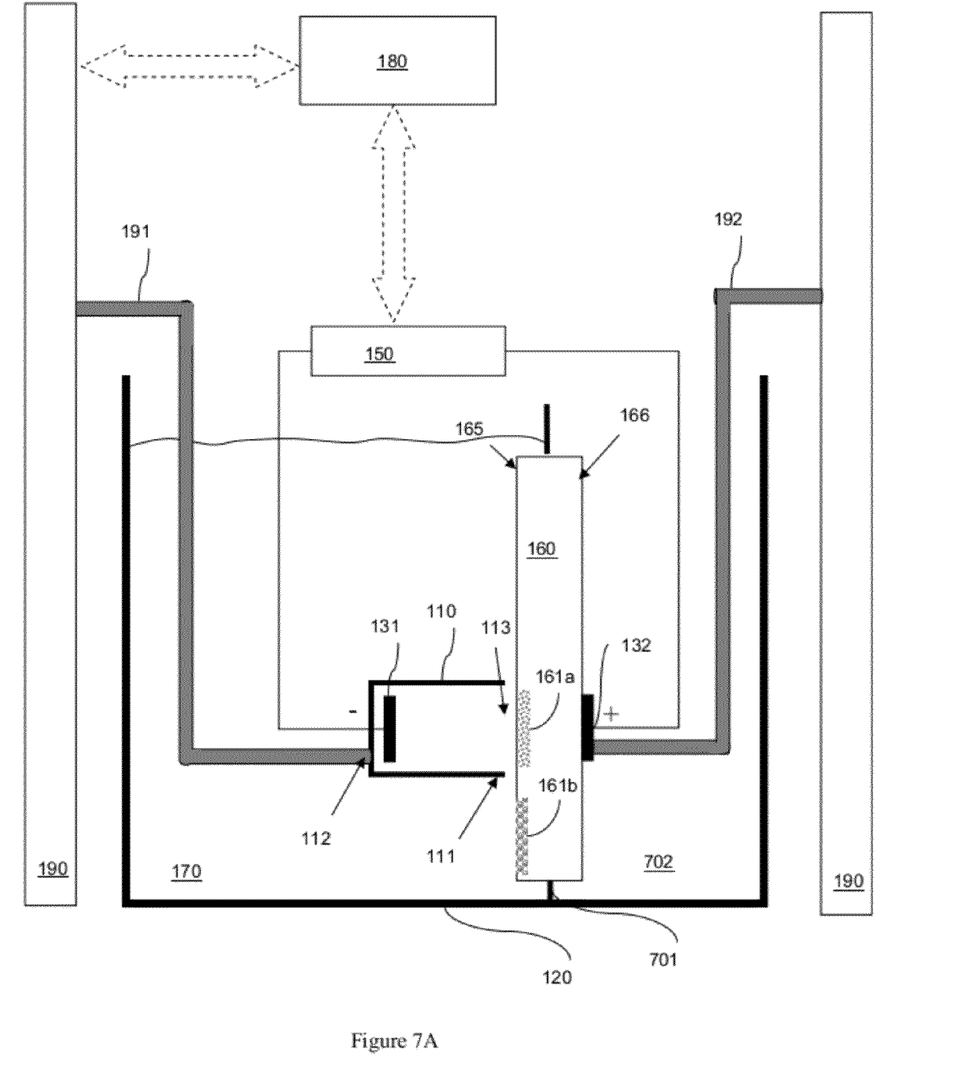
FIG. 7A is a schematic drawing illustrating of an alternative configuration for the system of FIG. 1.
Figure 7B:
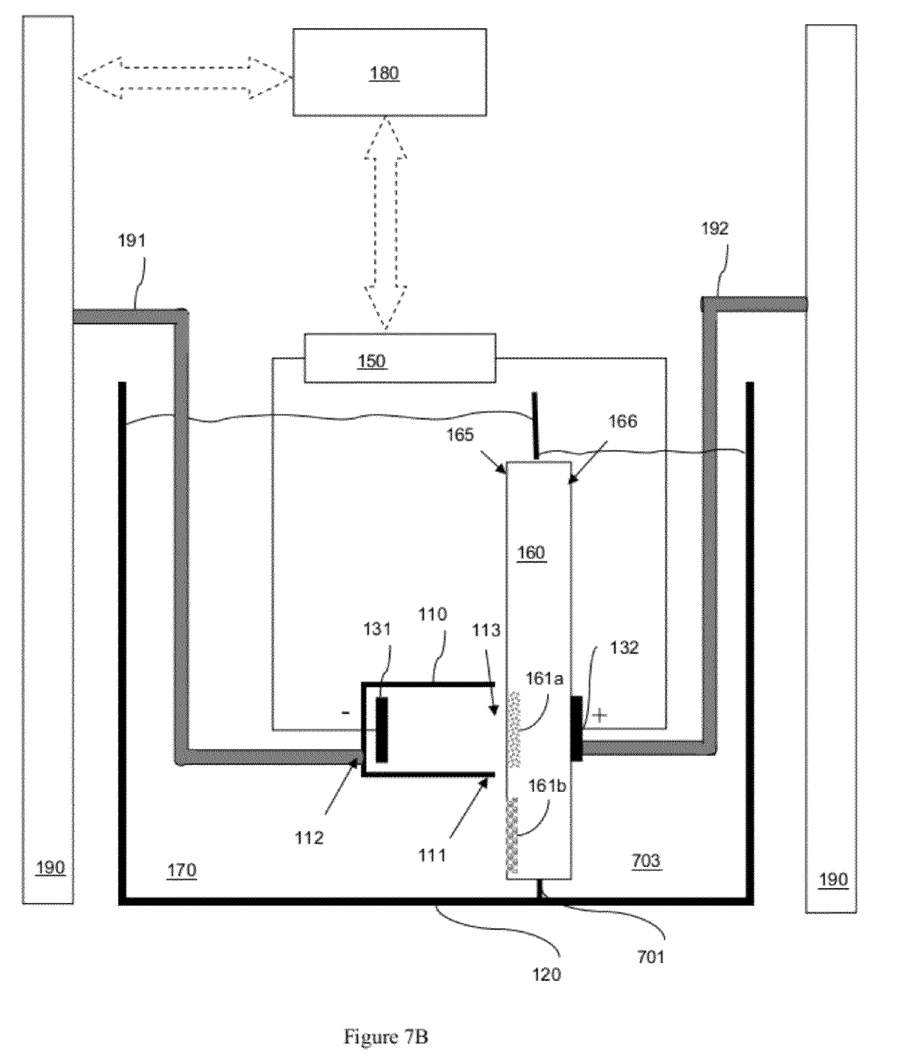
FIG. 7B is a schematic drawing illustrating of another alternative configuration for the system of FIG. 1.

Referring to FIGS. 7A and 7B, yet another refinement of the disclosed electrochemical etching systems 100 and 600 may include a second container 120, 620 (i.e., an outer container) with a divider 701 adapted to isolate the back surface 166, 666 of the workpiece from the electrolyte solution 170. Thus, for example, the back surface 166, 666 of the workpiece can be exposed to air 702 (see FIG. 7A). Alternatively, the back surface 166, 666 can be exposed to a different electrolyte solution 703 (e.g., a conducting salt solution, such as NaCl), thereby allowing different etch characteristics to be achieved on the front and back surfaces of the wafer (see FIG. 7B).

Also disclosed herein are method embodiments for performing an electrochemical etch using the above described system embodiments 100 and 200. Referring to FIG. 7 in combination with FIG. 1, one method embodiment comprises providing the first electrochemical etching system, described above (702). A workpiece 160 (e.g., a semiconductor wafer) is placed in the electrolyte solution 170 within the second container 120 (i.e., within outer container or electrolyte bath) such that the second electrode 132 is adjacent to (i.e., in contact with) the bottom surface 166 of the workpiece 160 and further such that the opening 113 of the first container 110 (i.e., the inner container), which is filled with the electrolyte solution 170, is adjacent to the top surface 165 of the workpiece 160 opposite the second electrode 132 (704). Specifically, the region 161 of the top surface 165 of the workpiece 160 to be etched is aligned between the opening 113 of the inner container 110 and the second electrode 132 (705).

Next, current flow through the electrolyte solution 170 within the inner container 110 between the first electrode 131 and the second electrode 132 is selectively controlled (e.g., by a controller 180, such as a computer or galvanostat) so as to selectively etch the region 161 of the top surface 165 of the workpiece 160 adjacent to the opening 113 in the inner container 110 (706). For example, if the workpiece 160 comprises a semiconductor wafer. The amount of current flow can be controlled in order to form a porous semiconductor region on the semiconductor wafer. This porous semiconductor region will have a predetermined size corresponding to a size of the opening 113 in the inner container 110.

During this controlling process (706), additional method steps can be performed in order to locally selectively etch sub-regions of the particular region 161 of the top surface 165 of the workpiece 160 being etched by the inner container 110. For example, the first electrode 131 can be moved within the inner container 110 relative to the top surface 165 of the workpiece 160 in order to locally selectively etch sub-regions within the region 161 ((707) see discussion of FIG. 3 above). Additionally or alternatively, isolated segments 431 of the first electrode 131 can be individually connected to a current source 150 in order to locally selectively etch sub-regions within the region 161 ((708) see discussion of FIG. 4 above). Specifically, each segment 431 can be selected alone or/in combination with any other segments 431, for example, by means of a multiplexor 180. Additionally or alternatively, the top surface 165 of the workpiece 160 can be shielded (e.g., by one or more electromagnetic shields 550) from at least one selected section 552 of the first electrode 131. Such shielding can block/divert current flow to avoid or at least minimize etching in some sub-regions with the region 161 in order to locally selectively etch one or more other sub-regions within the region 161.

Finally, this method embodiment can comprise moving the position of the workpiece 160 relative to the opening 113 of the inner container 110 (e.g., in a continuous or stepped manner) to allow for etching (i.e., continuous etch (712) or step and etch (711), respectively) of different regions of the top surface 165 of the workpiece 160 (710). As the position of the workpiece 160 relative to the inner container 110 is varied, the current flow can also be varied in order to achieve different structural and/or optical properties (i.e., different porosities and thicknesses) in the different regions on the workpiece 160 surface (711). In the case of a semiconductor wafer, the amount of current flow through the inner container 110 can be controlled so as to selectively adjust the structural and optical properties (i.e., the porosity and thickness) of the resulting porous semiconductor regions.

For example, the size of the opening 113 in the inner container 110 can correspond to the size of a die. If a step and etch technique (711) is used, the stepped movements can correspond to the die size as well as the known spacing between dies and a designer/manufacturer can chose to utilize different current densities in order to obtain different porosity at each die. Alternatively, a designer/manufacture may mass produce nominally identical dies by using the same current density and etching conditions at each die. If a continuous etching technique (712) is used, striped substrate surfaces can be created (e.g., with each stripe having a different porosity). These stripes can be considerably larger in size compared with the dimensions of the interior inner container 110. Furthermore, the current density may be varied to create porosity (optical constants) gradients. These types of gradients may find several implementations in metrology tool quality control and photonics. Note that the continuous etching technique (712) may be used to create die size structures similar to the ones created using the step and etch technique by periodically turning off the current along the scan direction.

Whether using the step and etch technique or the continuous etching technique, the moving process (710) can comprise moving the inner container 110 and the second electrode 132 relative to the workpiece 160 (e.g., using holders 191 adapted to be moved by motorized drives controlled by controller 180). Alternatively, this moving process (710) can comprise moving the workpiece 160 relative to the inner container 110 and the second electrode 132 so as to selectively etch different regions of the top surface 165 of the workpiece 160.

Figure 8:
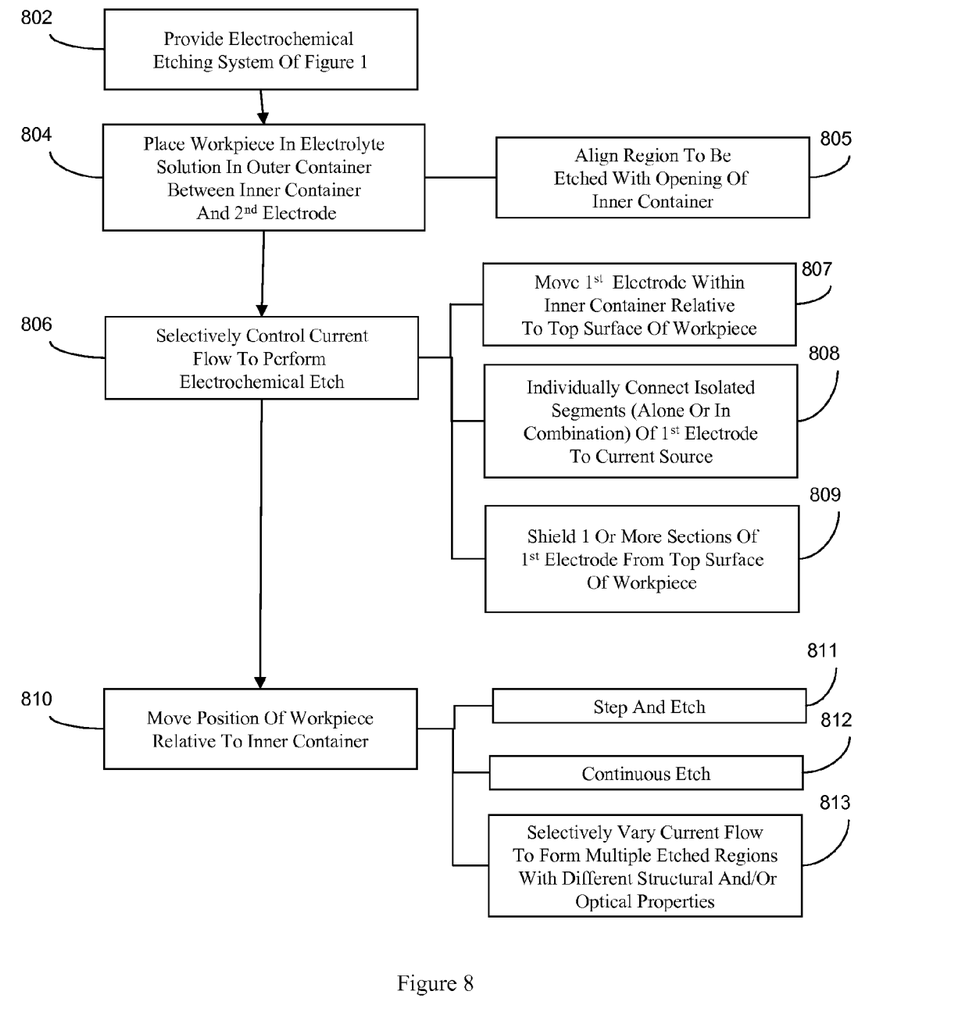
FIG. 8 is a flow diagram illustrating an embodiment of the method of the present invention.
Figure 9:
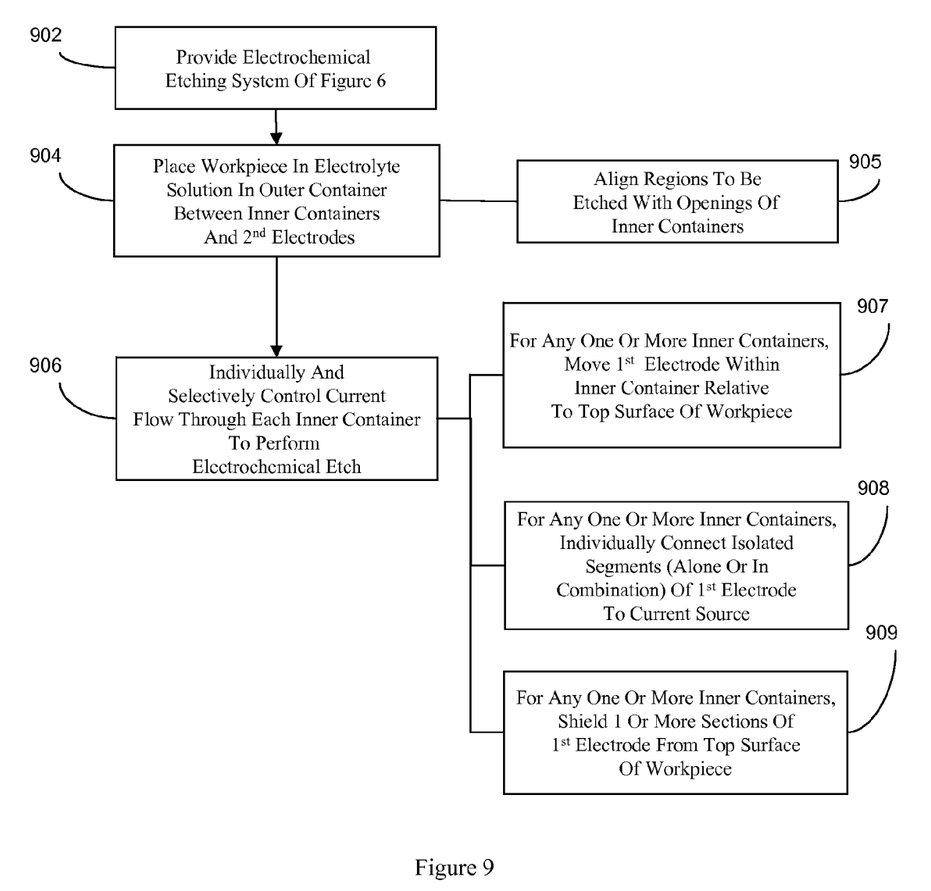
FIG. 9 is flow diagram illustrating another embodiment of the method of the present invention.

Referring to FIG. 8 in combination with FIG. 6, another method embodiment comprises providing the second electrochemical etching system 600, described above and illustrated in FIG. 6. In this embodiment, the workpiece 660 is placed in the electrolyte solution 670 within the second container 620 such that the second electrodes 632 are adjacent to the bottom surface 666 of the workpiece 660 and further such that the opening 613 of each one of the inner containers 610, which are filled with the electrolyte solution 670, is adjacent to the top surface 665 of the workpiece 660 opposite one of the second electrodes 632, thereby forming multiple first electrode-second electrode pairs (804). Specifically, the regions (e.g., 661*a*, 661*b*, 661*c*, etc.) of the top surface 665 of the workpiece 660 to be etched are aligned between the openings 113 of the different inner containers 610 and the second electrodes 632 (805).

Next, current flow through the electrolyte solution 670 between each one of the multiple first electrode-second electrode pairs 631-632 is individually controlled (e.g., by a controller 180, such as a computer or galvanostat) so as to selectively etch multiple regions 661*a-c* of the top surface 665 of the workpiece 660 (806). That is, each inner container 610 etches a different region 661*a*, 661*b*, 661*c*, etc. of the top surface 665 of the workpiece 660, that region corresponding to the opening 613 of the corresponding inner container 610 in each of the electrode pairs 631-632. For example, if the workpiece 660 comprises a semiconductor wafer. The amount of current flow through each inner container 610 can be selectively controlled in order to form multiple porous semiconductor regions 661*a-c* on the semiconductor wafer. These porous semiconductor regions 661*a-c* will each have a predetermined size corresponding to a size of the opening 613 in its corresponding inner container 610. Thus, the multiple individually controlled inner containers 610 allow for simultaneous etching of different regions 661*a-c* of the top surface 665 of the workpiece 660 and further can be used to achieve different structural and/or optical properties in those different regions 661*a-c*.

As with the previously described method embodiment, additional method steps can be performed during the controlling process (806) in order to locally selectively etch sub-regions of the regions 661*a-c* being etched by the inner containers 610. For example, for any one or more inner containers 610, the first electrode 631 can be moved within the inner container 610 relative to the top surface 665 of the workpiece 660 in order to locally selectively etch such sub-regions ((807) see discussion of FIG. 3 above). Additionally or alternatively, for any one or more of the inner containers 610, isolated segments 431 of the first electrode 631 can be individually connected to a current source 650 in order to locally selectively etch such sub-regions ((808) see discussion of FIG. 4 above). Specifically, each segment 431 can be selected alone or/in combination with any other segments 431, for example, by means of a multiplexor 680. Additionally or alternatively, for any one or more of the inner containers 610, the top surface 665 of the workpiece 660 can be shielded (e.g., by one or more electromagnetic shields 550) from at least one selected section 552 of the first electrode 631. Shielding can block/divert current flow to avoid or at least minimize etching in some sub-regions in order to locally selectively etch one or more other sub-regions.

It should be noted that during the above-described electrochemical etching processes (see process 706 of FIG. 7 and process 806 of FIG. 8), acid concentration (i.e., the chemical species concentration) in the electrolyte solution 170, 670 will tend to decrease as a function of the etch time. The main purpose of the outer container 120 of FIGS. 1 and 620 of FIG. 6 is to provide sufficient chemical species for a nearly constant concentration throughout the entire electrochemical treatment. Thus, the inner container(s) 110, 610 must be either spaced from the workpiece (e.g., at processes 704 or 804, respectively) or configured with openings to allow the electrolyte solution 170, 670 to flow freely between the inner container(s) 110, 610 and the outer container 120, 620.

Additionally, a refinement to the disclosed electrochemical etching method embodiments may include continuously replenishing the electrolyte chemical species in the electrolyte solution 170, 670 during processes 706 of FIG. 1 and 806 of FIG. 8 in order to maintain a constant chemical condition. Yet another refinement of the disclosed electrochemical etching method embodiments may include exposing the back surface 166, 666 of the workpiece to a different electrolyte solution than the electrolyte solution 170, 670 at the top surface of the workpiece and within the inner container(s) 110, 610. In this case, the workpiece itself would function as a barrier between the different electrolyte solutions on the front and back surfaces of the workpiece, thereby allowing different etch characteristics to be achieved on the front and back surfaces of the wafer.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an electrochemical etching system with localized etching capability. The system embodiments allow multiple porous semiconductor regions, having different optical and structural properties, to be formed on a single semiconductor wafer. The localized etching capability is achieved through the use of one or more stationary and/or movable computer-controlled inner containers operating within an outer container. The outer container holds the electrolyte solution and acts as an electrolyte supply source for the inner container(s) so that constant concentrations of chemical species are maintained throughout the electrochemical etching process. The inner container(s) limit the size of the etched region of the semiconductor wafer by confining the electric field. Additionally, the current amount passing through each inner container during the electrochemical etching process can be selectively adjusted to achieve a desired result within the etched region. Localized etching of sub-regions within each etched region can also be achieved through the use of different stationary and/or moveable electrode structures and shields within each inner container. Also disclosed are associated method embodiments. The above described system and method are most useful when multiple targets with different optical and structural properties are needed on the same wafer. Utilization areas may include calibration and monitor wafer fabrication for optical metrology system diagnostics, certain sensor and biomedical implementations and photonics device manufacturing. The advantages include multiple targets manufacturing on a single wafer resulting in reduced costs associated with multiple wafers implementations. For example, for optical metrology systems diagnostics, creating multiple targets on the same wafer not only eliminates the costs associated with requiring multiple wafers but it also results in reduced measurement throughput and improved systems utilization levels. Furthermore, complex lateral porosity gradients can be created using flexible and segmented cathode electrodes. Additional advantages of the proposed methodology are that the etching processes are relatively inexpensive and fast. For example, a 10-periods porous silicon Fabry-Perot filter or Bragg reflector takes about a minute to create.

What is claimed is:

1. An electrochemical etching system for etching a workpiece, said electrochemical etching system comprising:
   a plurality of first containers, each first container having a first end and a second end, said first end having an opening;
   a plurality of first electrodes, each first electrode being positioned within a corresponding first container at said second end;
   a plurality of second electrodes;
   an electrolyte solution;
   a second container larger than said first containers,
      said first containers being discrete containers relative to said second container,
      said second container containing said electrolyte solution and further containing said workpiece, said first containers and said second electrodes submerged within said electrolyte solution,
      said second electrodes being positioned adjacent to a bottom surface of said workpiece, and
      said first containers each being positioned with said opening adjacent to a different region of a top surface of said workpiece opposite a corresponding one of said second electrodes such that said first electrodes and said second electrodes are arranged in multiple first electrode-second electrode pairs; and
   a plurality of individually controllable current sources, each current source being connected to a corresponding first electrode-second electrode pair and further being capable of providing a current flow through said electrolyte solution between said corresponding first electrode-second electrode pair in order to selectively etch a specific region of said top surface of said workpiece.

2. The electrochemical etching system according to claim 1, said workpiece comprising a semiconductor wafer and each of said current sources being individually controllable in order to form multiple different porous semiconductor regions on said semiconductor wafer, said different porous semiconductor regions having predetermined sizes corresponding to sizes of openings in said first containers and further having different predetermined structural and optical properties.

3. The electrochemical etching system according to claim 1, at least one of said first electrodes in at least one of said first containers comprising a planar shape, said planar shape causing a current density within said electrolyte solution in said at least one of said first containers to be essentially uniform, creating an essentially uniformly etched surface structure within said specific region.

4. The electrochemical etching system according to claim 1, at least one of said first electrodes in at least one of said first containers comprising a non-planar shape, said non-planar shape causing a current density within said electrolyte solution in said at least one of said first containers to be non-uniform, creating a non-uniformly etched surface structure within said specific region.

5. The electrochemical etching system according to claim 1, further comprising a moveable first electrode holder holding said first electrode within at least one of said first containers, said moveable first electrode holder being moveable so as to allow for localized selective etching of sub-regions within said specific region.

6. The electrochemical etching system according to claim 1, at least one of said first electrodes within at least one of said first containers comprising a plurality of isolated segments, each of said isolated segments being individually connected to said current source so as to allow for localized selective etching of sub-regions within said specific region.

7. The electrochemical etching system according to claim 1, further comprising an electromagnetic shield within at least one of said first containers between at least one selected section of said first electrode and said top surface of said workpiece so as to allow for localized selective etching of a sub-region within said specific region.

8. A method for electrochemical etching of a workpiece, said method comprising:
   providing an electrochemical etching system, said system comprising:
      a plurality of first containers, each first container having a first end and a second end, said first end having an opening;
      a plurality of first electrodes, each first electrode being positioned within a first container at said second end;
      a plurality of second electrodes;
      an electrolyte solution; and a second container larger than said first containers,
   said first containers being discrete containers relative to said second container,
   said second container containing said electrolyte solution and further containing, said workpiece, said first containers and said second electrodes submerged within said electrolyte solution,
   said second electrodes being positioned adjacent to a bottom surface of said workpiece, and
   said first containers each being positioned with said opening adjacent to a different region of a top surface of said workpiece opposite a corresponding one of said second electrodes such that said first electrodes and said second electrodes are arranged in multiple first electrode-second electrode pairs; and individually controlling current flow through said electrolyte solution between each one of said multiple first electrode-second electrode pairs so as to selectively etch multiple different regions of said top surface of said workpiece.

9. The method according to claim 8, said workpiece comprising a semiconductor wafer and said individually controlling further comprising individually controlling an amount of said current flow between said first electrode-second electrode pairs in order to form different porous semiconductor regions on said semiconductor wafer, said different porous semiconductor regions having predetermined sizes corresponding to sizes of openings in said first containers.

10. The method according to claim 8, further comprising, during said individually controlling, moving a first electrode within at least one of said first containers relative to said top surface in order to locally selectively etch sub-regions within a specific region of said top surface.

11. The method according to claim 8, further comprising, at least one of the following:
   during said individually controlling, individually connecting isolated segments of a first electrode in one of said first containers to a current source in order to locally selectively etch sub-regions within a specific region of said top surface; and
   during said individually controlling, within one of said first containers shielding said top surface of said workpiece from at least one selected section of said first electrode in order to locally selectively etch a sub-region within a specific region of said top surface.

* * * * *